(12) United States Patent
Wengler et al.

(10) Patent No.: US 11,388,808 B2
(45) Date of Patent: Jul. 12, 2022

(54) BIPHASIC PLASMA MICROREACTOR AND METHOD OF USING THE SAME

(71) Applicants: Paris Sciences et Lettres-Quartier Latin, Paris (FR); Centre National de la Recherche Scientifique (CNRS), Paris (FR); Sorbonne Universite, Paris (FR); Ecole Nationale Superieure de Chimie de Paris, Paris (FR)

(72) Inventors: Julien Wengler, Paris (FR); Stéphanie Ognier, Paris (FR); Safwan Al Ayoubi, Wattignies (FR); Michael Tatoulian, Paris (FR)

(73) Assignees: Paris Sciences et Lettres, Paris (FR); Centre National de la Recherche Scientifique (CNRS), Paris (FR); Sorbonne Universite, Paris (FR); Ecole Nationale Supérieure de Chimie de Paris, Paris (FR)

( * ) Notice: Subject to any disclaimer, the term of this patent is extended or adjusted under 35 U.S.C. 154(b) by 0 days.

(21) Appl. No.: 16/976,239

(22) PCT Filed: Feb. 28, 2019

(86) PCT No.: PCT/EP2019/055027
§ 371 (c)(1),
(2) Date: Aug. 27, 2020

(87) PCT Pub. No.: WO2019/166570
PCT Pub. Date: Sep. 6, 2019

(65) Prior Publication Data
US 2021/0051789 A1  Feb. 18, 2021

(30) Foreign Application Priority Data
Feb. 28, 2018  (EP) .................................. 18305214

(51) Int. Cl.
*H05H 1/24* (2006.01)
*H01J 37/20* (2006.01)
*H01J 37/32* (2006.01)

(52) U.S. Cl.
CPC ........... *H05H 1/2406* (2013.01); *H01J 37/20* (2013.01); *H01J 37/32348* (2013.01); *H01J 37/32449* (2013.01); *H05H 1/2443* (2021.05)

(58) Field of Classification Search
CPC ................. H01J 37/32; H01J 37/32348; H01J 37/32449; H01J 37/20
See application file for complete search history.

(56) References Cited

U.S. PATENT DOCUMENTS 8,871,444 B2 * 10/2014 Griffiths ............ B01L 3/502753
   435/6.1
9,150,852 B2 * 10/2015 Samuels ............ G01N 33/5436
(Continued)

FOREIGN PATENT DOCUMENTS

WO    2017097996 A1    6/2017

OTHER PUBLICATIONS

Apr. 2, 2019 (WO) International Search Report PCT/EP2019/055027.
(Continued)

Primary Examiner — Srinivas Sathiraju
(74) Attorney, Agent, or Firm — Banner & Witcoff, Ltd.

(57) ABSTRACT

The present invention relates to a plasma reactor and more specifically to an plasma microreactor comprising a support, made at least partially of a dielectric material, the support comprising a gas inlet, a liquid inlet, at least a fluid outlet, a liquid microchannel in the support, a gas channel, at least a ground electrode, at least a high voltage electrode, separated from the gas channel by the dielectric material of the support, wherein said ground electrode and said high voltage
(Continued)

electrode are arranged on opposite sides of the gas channel so as to be able to create an electric field inside the gas channel, wherein the liquid microchannel and the gas channel are contiguous and at least an opening is arranged between the liquid microchannel and the gas channel so as to form a fluid channel and to cause the liquid flow contact the gas flow and wherein the liquid flow is retained within the liquid microchannel by capillarity action.

17 Claims, 12 Drawing Sheets

(56) References Cited

U.S. PATENT DOCUMENTS

| | | | | |
|---|---|---|---|---|
| 9,186,643 | B2* | 11/2015 | Griffiths | B01L 3/502746 |
| 9,328,344 | B2* | 5/2016 | Link | B01L 3/502784 |
| 9,390,894 | B2* | 7/2016 | Eden | H01J 37/32908 |
| 9,410,151 | B2* | 8/2016 | Link | C40B 40/04 |
| 9,498,759 | B2* | 11/2016 | Griffiths | B01F 5/0256 |
| 9,534,216 | B2* | 1/2017 | Link | B82Y 30/00 |
| 9,562,837 | B2* | 2/2017 | Link | C12Q 1/6827 |
| 9,562,897 | B2* | 2/2017 | Samuels | G01N 33/532 |
| 9,839,890 | B2* | 12/2017 | Griffiths | B01F 5/0655 |
| 9,861,950 | B2* | 1/2018 | Locke | C05C 5/00 |
| 10,308,885 | B2* | 6/2019 | Fridman | C10L 1/04 |
| 10,533,998 | B2* | 1/2020 | Link | C40B 40/04 |
| 10,610,850 | B2* | 4/2020 | Locke | C05C 5/00 |
| 10,625,235 | B2* | 4/2020 | Eden | C01B 13/115 |
| 10,837,883 | B2* | 11/2020 | Kleinschmidt | G01N 1/38 |
| 2005/0087122 | A1* | 4/2005 | Ismagliov | G01N 35/08 117/2 |
| 2005/0233198 | A1* | 10/2005 | Nuzzo | H01M 8/1037 204/432 |
| 2005/0272159 | A1* | 12/2005 | Ismagilov | G01N 35/08 436/34 |
| 2009/0020413 | A1* | 1/2009 | Popp | B01J 19/088 204/164 |
| 2010/0027118 | A1* | 2/2010 | Rosenman | G02B 26/005 359/507 |
| 2011/0215277 | A1* | 9/2011 | Khan | B01J 8/00 252/408.1 |
| 2013/0071297 | A1* | 3/2013 | Eden | C01B 13/115 422/186.07 |
| 2014/0227176 | A1* | 8/2014 | Marc-Andre | A61K 49/1863 424/1.29 |
| 2015/0270110 | A1* | 9/2015 | Eden | H01J 37/32908 422/186.04 |
| 2016/0327310 | A1* | 11/2016 | Dai | C01B 13/0207 |
| 2018/0099257 | A1* | 4/2018 | Eden | C01B 13/115 |
| 2018/0369778 | A1* | 12/2018 | Tatoulian | B01J 19/249 |
| 2021/0051789 | A1* | 2/2021 | Wengler | H05H 1/2406 |

OTHER PUBLICATIONS

May 7, 2018 (EP) European Search Report Application No. 18305214.
Zhang et al, A plasma/liquid microreactor for radical reaction chemistry: An CAVDV4 experimental and numerical investigation by EPR spin trapping. Plasma Process and Plymers, Dec. 6, 2017.
Malik, M. A. (2010). Water purification by plasmas: Which reactors are most energy efficient?, Plasma Chemistry and Plasma Processing, 30(1), 21-31.
Yano, T., Uchiyama, I., Fukawa, F., Teranishi, K., & Shimomura, N. (May 2008). Water treatment by atmospheric discharge produced with nanosecond pulsed power. In IEEE International Power Modulators and High Voltage Conference, Proceedings of the 2008 (pp. 80-83). IEEE.
Matsui, Y., Takeuchi, N., Sasaki, K., Hayashi, R., & Yasuoka, K. (2011). Experimental and theoretical study of acetic-acid decomposition by a pulsed dielectric-barrier plasma in a gas-liquid two-phase flow. Plasma Sources Science and Technology, 20(3), 034015.
Zhang, M., Ognier, S., Touati, N., Binet, L., Thomas, C., Tabeling, P., & Tatoulian, M. (2017). The development and numerical simulation of a plasma microreactor dedicated to chemical synthesis. Green Processing and Synthesis, 6(1), 63-72.
Knaust, S., Andersson, M., Hjort, K., & Klintberg, L. (2016). Influence of surface modifications and channel structure for microflows of supercritical carbon dioxide and water. The Journal of Supercritical Fluids, 107, 649-656.
Bartolo, D., Degré, G., Nghe, P., & Studer, V. (2008). Microfluidic stickers. Lab on a Chip, 8(2), 274-279.

* cited by examiner

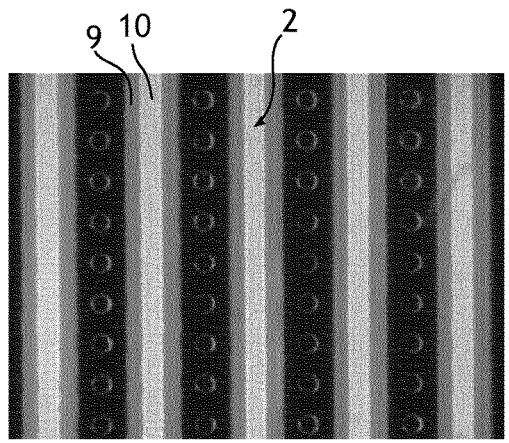
Figure 18A
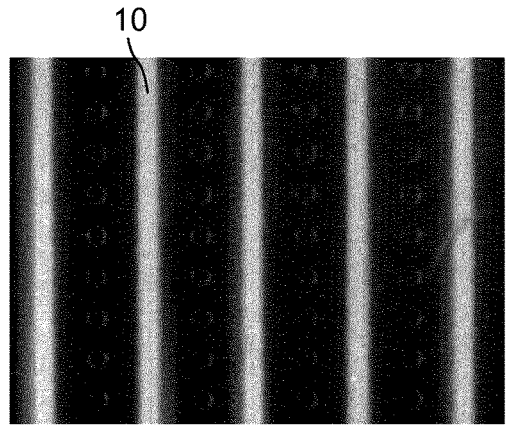
Figure 18B
Figure 19

BIPHASIC PLASMA MICROREACTOR AND METHOD OF USING THE SAME

TECHNICAL FIELD

The present invention relates to a gas-liquid plasma microreactor and to a method using such a device for generating a plasma and to perform chemical synthesis. The microreactor according to the invention aims at generating plasma in a gas flowing along a liquid by applying an appropriate electric field so that the reactive species or molecules formed in the plasma can be efficiently transferred into the liquid.

BACKGROUND OF THE INVENTION

Plasma discharges are known to generate reactive species in gas phase (such as radicals, neutrals in different excited states, photons and electrons), at room temperature and pressure. The use of plasma discharges is known to perform chemical synthesis, particularly in gas. However, the use of gas limits the amount of matter involved in the synthesis.

Therefore, biphasic gas-liquid plasma reactors have been developed. The effectiveness of those reactors is limited by the transfer of active species formed by plasma discharge from gas to liquid. The effectiveness of the different types of plasma reactors for transferring active species has been evaluated by Malik et al. [1]. These authors compared 27 different versions of plasma reactors using the energy required to obtain 50% discoloration of dyes in water (G50 expressed in g/kWh). Their conclusion was that the most efficient reactors are pulsed powered reactors in which the liquid (i) is sprayed in the plasma zone or (ii) flows down the inner wall of a cylindrical electrode as a thin film. The improvement of efficiency was explained by the large surface-to-volume ratio of the liquid, resulting in a faster rate of transfer of reactive species from gas to liquid and the short distance through which a pollutant molecule in liquid needs to diffuse in order to reach the liquid surface.

Particularly, Yano et al. [2] describe a wetted wall plasma reactor, wherein a thin film of liquid flows down the inner walls of a cylindrical electrode in the presence of a discharge in the gas between wire-to-cylinder electrodes. The problem of such a reactor is that uniform liquid films are difficult to obtain, especially thin liquid films (<1 mm).

Matsui et al. [3] describe a two-phase flow reactor to decompose acetic acid in water. Pulsed dielectric barrier discharge was generated in oxygen bubbles flowing in water. The reactor consisted in two coaxial glass tubes, the gap between the inner tube and the outer tube being 1 mm. A bubbler at the bottom of the reactor was used to create gas bubbles. Good results were obtained in terms of acetic acid decomposition. The drawback of this reactor is however the large size of the bubbles (from 0.1 cm to 1 cm) and the poor control of the bubble size leading to a large size distribution of the bubbles. The consequence is that some parts of the liquid may absorb too much radicals while other parts may lack radicals.

Therefore, microfluidic channels have been used to enhance the control of the size distribution. By using microfluidic tools, Zhang et al. [4], [5], have developed a plasma microreactor wherein micro-sized bubbles are generated using a traditional flow-focusing geometry. Plasma discharges are then generated repeatedly in the micro-sized dispersed gas bubbles moving in the continuous liquid phase thanks to high-voltage electrodes positioned on each side of the channel. Due to the high surface over volume ratio of gas bubbles, the reaction products can be extracted very rapidly, for example in milliseconds, from the plasma phase. Together with the development of the microreactor, experimental (Electron Spin Resonance spectroscopy, fluorescence) and theoretical (plasma modelling) methods aiming to quantify and qualify the generated radical species have been implemented. In the case of a water/argon diphasic flow, the production of dissolved $OH°$ radicals has been evidenced and quantified, making hydroxylation reactions possible. However, working with bubbles limits the amount of gas seen by a given portion of the liquid, which hinders the use of the gas constituents as reagent for the liquid phase. Besides, the residence times of both phases are strongly correlated, and limited by the flow rates necessary for the production of bubbles.

SUMMARY OF THE INVENTION

A plasma microreactor has been developed to respond at least partially to the above-mentioned issues of the prior art. The plasma microreactor comprises:
  a support, made at least partially of a dielectric material, the support comprising a gas inlet, adapted to be connected to a gas reservoir, a liquid inlet, adapted to be connected to a liquid reservoir and at least a fluid outlet adapted to be connected to a receiver containing gas and/or liquid,
  a liquid microchannel in the support adapted to allow a liquid flow from the liquid inlet to the fluid outlet,
  a gas channel, in the support adapted to allow a gas flow from the gas inlet to the fluid outlet,
  at least a ground electrode,
  at least a high voltage electrode, separated from the gas channel by the dielectric material of the support,
  wherein said ground electrode and said high voltage electrode are arranged on opposite sides of the gas channel so as to be able to create an electric field inside the gas channel,
  wherein the liquid microchannel and the gas channel are contiguous and at least an opening is arranged between the liquid microchannel and the gas channel so as to form a fluid channel and to cause the liquid flow contact the gas flow and wherein the liquid flow is retained within the liquid microchannel by capillarity action.

In further optional aspects of the invention:
  at least one, and notably one, opening is arranged between the liquid microchannel and the gas channel on at least 80%, notably 90%, such as about 100%, of the length of the fluid channel.
  the opening is partially defined by a convex bended portion arranged between the liquid microchannel and the gas channel, said convex bended portion extending continuously along the length of the liquid microchannel and along the length of the gas channel,
  the convex bended portion has a radius of curvature being less than 20 µm,
  the convex bended portion defines an edge along the length of the liquid microchannel and along the length of the gas channel,
  the plasma microreactor comprises a high voltage source electrically connected to the ground electrode(s) and to the high voltage electrode(s),
  at least one of the ground electrode and the high voltage electrode is embedded in the support,
  the length of the gas channel and the length of the liquid microchannel are over 2 cm, notably over 20 cm and preferably over 100 cm, the support is made of a UV-cured polymer such as a polymer obtained by photopolymerisation of a thiol-ene based resin, a poly(tetramethylene succinate), a cyclic olefin copolymer (COC) such as a copolymer of ethylene and norbornene or tetracyclododecene, glass, a ceramic material, or a combination thereof, two liquid microchannels are arranged on opposite sides of the gas channel, so that the liquid microchannel formed by said liquid microchannels and said gas channel has a T-shaped section, a fluid channel is formed by the liquid microchannel(s) and by the gas channel(s), said fluid channel being arranged following a main plane, the design of the fluid channel allowing to have a surface density of the fluid channel in said plane higher than 0.3 over a square of at least 20 mm$^2$, at least a portion of the fluid channel is arranged in a serpentine pattern, the liquid microchannel has a smaller height than the gas channel so as to form a step between the liquid microchannel and the gas channel, the support is entirely made of glass or in ceramic material or at least made of a polymeric layer comprised between two glass layers, the height of the liquid microchannel is more than 1 µm, notably more than 10 µm, preferably more than 40 µm and is less than 200 µm, notably less than 100 µm, preferably less than 50 µm.

the height of the gas channel is comprised between the height of the liquid microchannel and 1 mm, notably between the height of the liquid microchannel and 200 µm and preferably between the height of the liquid microchannel and 100 µm.

Another aspect of the present invention is a method for generating a plasma in a plasma microreactor, comprising the steps of:
(a) providing the above described plasma microreactor,
(b) providing a liquid and making the liquid flow through the liquid microchannel(s) in a given direction,
(c) providing a gas and making the gas flow through the gas channel in said direction,
(d) applying a high voltage between the high voltage electrode(s) and the ground electrode so as to generate a plasma in the gas channel.

In further optional aspects of the invention:
the gas flow rate through the gas channel is higher than the liquid flow rate through the liquid microchannel, preferably between than 5 times and 10000 times the liquid flow rate in the liquid microchannel, notably comprised between 50 times and 2000 times the liquid flow rate in the liquid microchannel, and preferably comprised between 80 times and 1000 times the liquid flow rate in the liquid microchannel, the gas is selected from air, argon, helium, oxygen, hydrogen, nitrogen, water vapor, ammoniac, carbon dioxide, carbon monoxide, volatile hydrocarbons such as methane, volatile organic compounds and a mixture thereof, the liquid is selected from solvents, more particularly from organic or aqueous solvents, such as water, an aliphatic hydrocarbon, an aromatic hydrocarbon, an alcohol, an ether, an ester, a ketone, a halogenated solvent, dimethylsulfoxide (DMSO), acetonitrile, dimethylformamide (DMF), an ionic liquid or a mixture thereof; and reagents such as methyl methacrylate (MMA) or phenol; or a mixture thereof, the high voltage is comprised between 250 V and 30 kV, notably between 1 kV and 20 kV, preferably between 1 kV and 10 kV, the high voltage is a variable, such as sinusoidal, high voltage with a frequency comprised advantageously between 100 Hz and 1 MHz, in particular comprised between 100 Hz and 100 kHz, preferably comprised between 100 Hz and 10 kHz, or the high voltage is a pulsed voltage with a frequency comprised advantageously between 100 Hz and 1 MHz, in particular comprised between 100 Hz and 100 kHz, preferably comprised between 100 Hz and 10 kHz, a compound present in the liquid, such as a solvent or a reagent, is submitted to at least a chemical reaction such as cleaving, oxidation, hydrogenation, dehydrogenation, amination or carbonylation.

Definitions

The term "length" of a channel will be used herein to designate the size of a channel according to the main flow direction of a fluid through the channel.

The term "height" of a channel will be used herein to designate the minimum size of a channel in a first direction transverse to the main flow direction of a fluid through the channel.

The term "width" of a channel will be used herein to designate the maximum size of a channel in a direction transverse to the main flow direction of a fluid through the channel and transverse to the first direction.

The term "microchannel" or "microfluidic channel" will be used therein to designate a channel comprising at least one inlet and at least one outlet, the height of which is comprised between 100 nm and 1 mm. A microchannel has at least a wall in a material adapted for flowing a liquid and/or a gas.

The term "microreactor" will be used therein to designate a device comprising a housing which minimum size is comprised between 100 nm and 1 mm. More precisely, the term "microreactor" will be used therein to designate a device comprising at least a microchannel.

The term "convex" will be used therein to define a surface or the section of a surface defining a bump. More specifically, a "convex bended portion" of the wall of a fluidic channel is a portion of the wall wherein, for two points chosen on the convex bended portion of the wall, the segment between the two points is not comprised by the fluidic channel.

BRIEF DESCRIPTION OF THE DRAWINGS

The invention will be described by way of example, with reference to the accompanying drawings in which:

FIG. 18A and FIG. 18B are top view images of the plasma microreactor, FIG. 19 illustrates a gas flow and a liquid flow in a plasma microreactor according to a possible embodiment of the invention, and in a flat fluid channel.

DETAILED DESCRIPTION OF PREFERRED ASPECTS OF THE INVENTION

Architecture of the Microreactor

Figure 1:
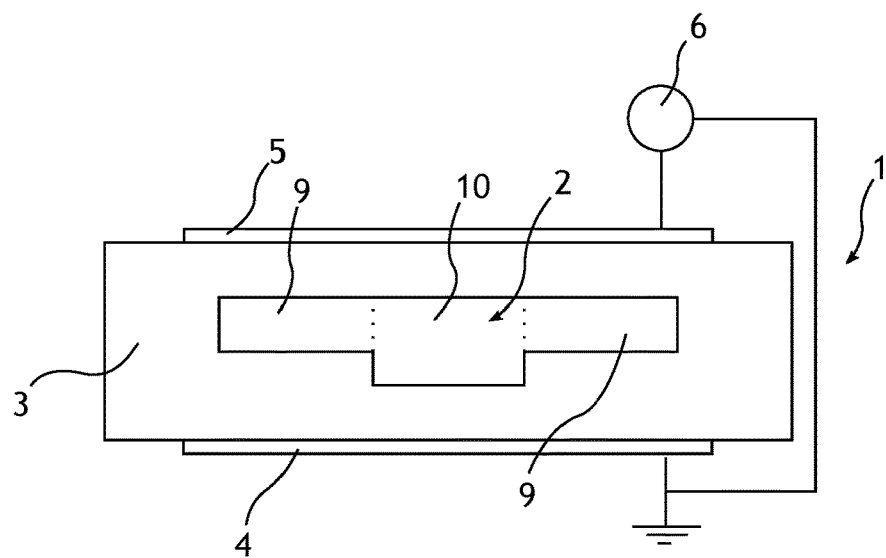
FIG. 1 diagrammatically shows a cross section view of a plasma microreactor according to a possible embodiment of the invention, FIG. 2 diagrammatically shows a cross section view of a plasma microreactor according to a possible embodiment of the invention.

Referring to FIG. 1, the plasma microreactor 1 includes a support 3. The support 3 comprises a gas channel 10 and two liquid microchannels 9, arranged on opposite sides of the gas channel 10 so as to form a fluid channel 2 having a T-shape cross section. A ground electrode 4 and a high voltage electrode 5 are arranged on opposite sides of the gas channel 10. The high voltage electrode 5 and the ground electrode 4 are electrically connected to a high voltage source 6 and separated from the fluid channel 2 by a dielectric material of the support 3.

Dielectric Material

The support 3 according to the present invention is at least partially made of a dielectric material in order to isolate the gas channel 10, since a high-voltage electric field can be controlled inside the support 3 between the electrodes 4,5. The dielectric material used in the present invention can be any material known for its dielectric properties. However, the dielectric material will be advantageously impervious to gas and liquid which have to flow through the fluid channel comprised in the support 3. Moreover, the dielectric material should also advantageously allow the formation of the support 3 comprising at least a liquid microchannel 9 and a gas channel 10, and for example embedded electrodes. The dielectric material can thus be a UV-cured polymer (i.e. a polymer obtained by photopolymerisation of monomers or prepolymers), such as a polymer obtained by photopolymerisation of a thiol-ene based resin (for example a Norland Optical Adhesive® (NOA), such as NOA-81 or NOA-61, preferably NOA-81), a poly(tetramethylene succinate) (PTMS), a cyclic olefin copolymer (COC) such as a copolymer of ethylene and norbornene or tetracyclododecene, glass, a ceramic material, or a combination thereof. In a preferred embodiment of the invention, the support 3 is made of a polymeric layer comprised between two glass layers, for example two glass coverslips. In another preferred embodiment of the invention, the support 3 is entirely made of glass or of ceramic material. In order to form the liquid microchannel(s) 9 and the gas channel(s) 10, glass can be micromachined by chemical wet etching (using HF selective etching for example) and/or laser engraving.

Liquid Microchannel(s) and Gas Channel(s)

In all the embodiments of the invention, the support 3 comprises at least a gas channel 10, preferably at least gas microchannel, and at least a liquid microchannel 9 so as to form at least a fluid channel 2, each liquid microchannel 9 being contiguous with a gas channel 10, an opening being arranged between each liquid microchannel 9 and at least a gas channel 10 to cause a liquid 8 in said liquid microchannel 9 to contact a gas 12 in said gas channel 10, the liquid 8 flow being retained within the liquid microchannel 9 by capillarity action.

Figure 2:
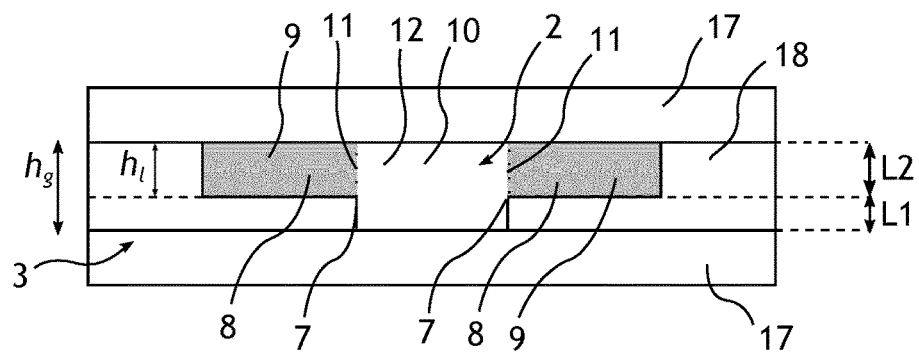

In reference to FIG. 2, the support 3 comprises a gas channel 10 and two liquid microchannels 9 so as to form a fluid channel 2 having a T-shape cross section. Each liquid microchannel 9 is contiguous with the gas channel 10. An opening 11 is arranged between each liquid microchannel 9 and the gas channel 10 to cause the liquid 8 in the liquid microchannel 9 to contact a gas 12 in the gas channel 10, the liquid 8 flow being retained within the liquid microchannel 9 by capillarity action. It is known to adapt the shape and the dimensions of a fluid channel 2 formed by the liquid microchannels 9 and by the gas channel 10, to retain a liquid 8 in the liquid microchannel 9 by capillarity action. For example, it is possible to pin a triple line (i.e. a line where a gas phase, a liquid phase and a solid phase coexist) at a convex bended portion 7, specifically a sharp edge of the wall of the fluid channel 2. This convex bended portion 7 may partially define the opening 11. Knaust et al. [6] for example describe a fluid channel comprising a 10 μm high guide as a convex bended portion, at the bottom along the middle of the channel. The high guide is adapted to pin a triple line in order to separate a liquid microchannel in which a water flow is stabilized, and a gas channel in which a supercritical $CO_2$ flow is stabilized, as the water and the $CO_2$ are in contact.

The convex bended portion 7 partially defines the opening 11, arranged between the liquid microchannel 9 and the gas channel 10. The convex bended portion 7 is extending continuously along the length of the liquid microchannel 9 and of the gas channel 10. Preferably, the radius of curvature of the convex bended portion 7 is less than 50 μm, notably less than 20 μm and preferably less than 5 μm. Therefore, said convex bended portion 7 is adapted to pin a triple line when a liquid 8 is injected in the liquid microchannel, and to enable the stabilization of a liquid flow in a liquid microchannel 9, and of a gas flow in the gas channel 10, the liquid flow contacting the gas flow at the opening 11.

The height $h_l$ of the liquid microchannel 9 is comprised between 500 nm and 500 μm, notably between 2 μm and 200 μm and preferably between 5 μm and 100 μm. The height $h_g$ of the gas channel 10 is comprised between 500 nm and 1 mm, notably between 2 μm and 200 μm and preferably between 5 μm and 100 μm.

In a preferred embodiment, the liquid microchannel 9 can have a smaller height than the gas channel 10, so as to form a step between the liquid microchannel 9 and the gas channel 10. The convex bended portion 7 is, in this case, the edge of the step between the liquid microchannel 9 and the gas channel 10. Therefore, the liquid 8 can be maintained within the liquid microchannel 9 by capillarity action. In reference to FIG. 2, the fluid channel 2 can be made in the support 3 by micromachining a layer 18 in which the fluid channel 2 is designed, said layer 18, advantageously made of a polymer, being sandwiched between two support layers 17, such as glass layers, optionally comprising the electrodes. The layer 18 can be therefore formed of a first layer L1 wherein a part of the gas channel 10 is designed, and a second layer L2 wherein another part of the gas channel 10 and the liquid microchannel 9 are designed. In this embodiment, the height of the gas channel 10 is preferably comprised between the height of the liquid microchannel 9 and 200 μm, notably between the height of the gas channel 10 and 100 μm.

Figure 3A:
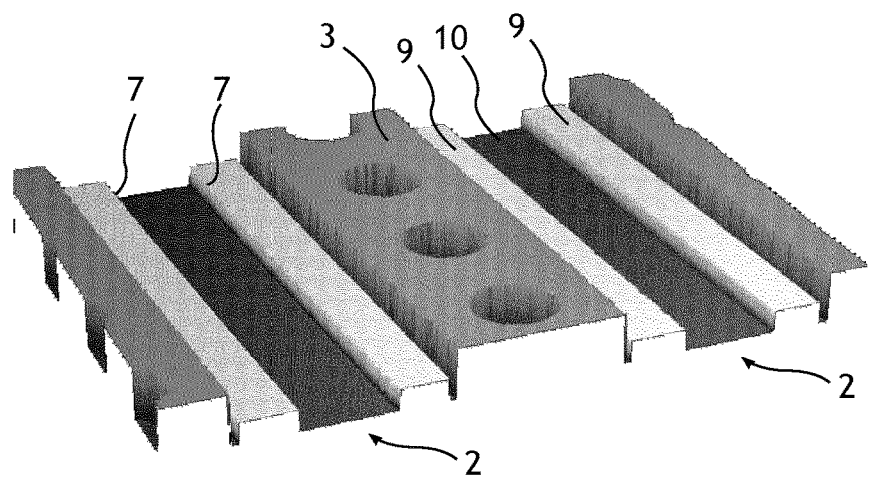
FIG. 3A is an optical profilometer image of two parallel portions of a fluid channel, FIG. 3B diagrammatically shows a cross section view of a plasma microreactor according to a possible embodiment of the invention, FIG. 3C diagrammatically shows a three-dimensional view of a plasma microreactor according to a possible embodiment of the invention, FIG. 3D diagrammatically shows a cross section view of a plasma microreactor according to a possible embodiment of the invention.

FIG. 3A is an optical profilometer image of two parallel portions of fluid channel 2. In each fluid channel 2, the gas channel 10 is surrounded by two liquid microchannels 9 arranged at the opposite side of the gas channel 10. Therefore, the contact between the gas phase and the liquid phase is optimized compared to an arrangement comprising only one liquid microchannel 9 and a gas channel 10 contiguous to the liquid microchannel 9. The different fluid channels 2 can be parallelized, and separated by the support 3. Therefore, the amount of species transferred to the liquid phase can be increased.

Figure 3B:
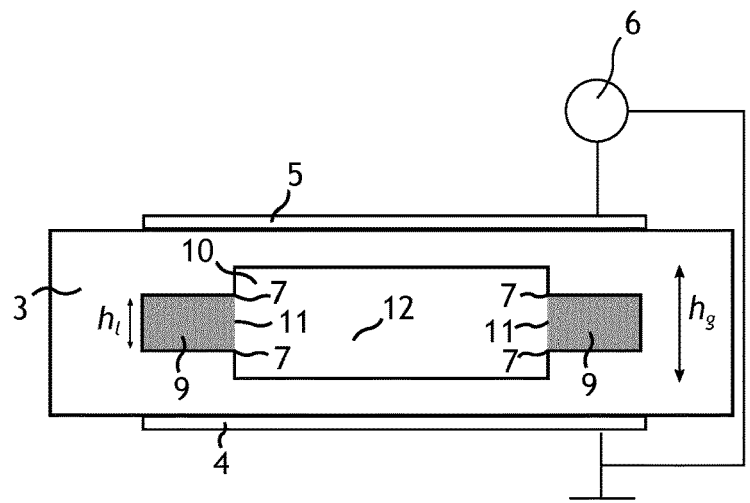

FIG. 3B illustrates schematically a different possible embodiment of the invention. The support 3 can comprise a gas channel 10 and two liquid microchannels 9 so as to form a fluid channel 2 having a cross-shape cross section. Each liquid microchannel 9 is contiguous with the gas channel 10. An opening 11 is arranged between each liquid microchannel 9 and the gas channel 10 to cause the liquid 8 in the liquid microchannel 9 to contact a gas 12 in the gas channel 10, the liquid 8 flow being retained within the liquid microchannel 9 by capillarity action. Each liquid microchannel 9 and the gas channel 10 can be arranged so that two convex portions 7 define the opening 11. Each of the convex portions 7 of an opening 11 is extending continuously along the length of the liquid microchannel 9 and of the gas channel 10. Therefore, the capillary action retaining the liquid 8 flow can be increased in comparison with an opening 11 having one convex portion 7.

The height $h_l$ of the liquid microchannel 9 is advantageously comprised between 500 nm and 500 μm, notably between 2 μm and 200 μm and preferably between 5 μm and 100 μm. The height $h_g$ of the gas channel 10 is advantageously comprised between 500 nm and 1 mm, notably between 2 μm and 200 μm and preferably between 5 μm and 100 μm.

The liquid microchannel 9 can have a smaller height than the gas channel 10, so as to form two steps between the liquid microchannel 9 and the gas channel 10. The convex bended portions 7 are, in this case, the edges of the steps between the liquid microchannel 9 and the gas channel 10.

Figure 3C:
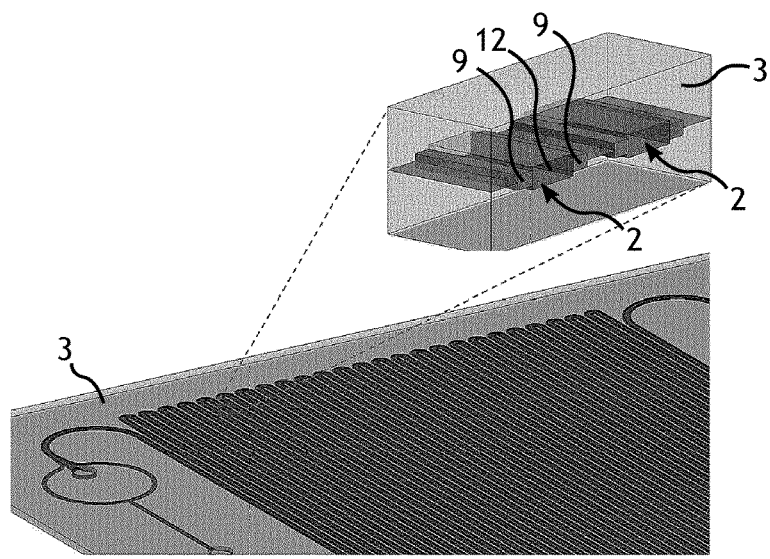

FIG. 3C is a schematic view of the embodiment illustrated in FIG. 3B, wherein each opening 11 is defined by two convex portions 7. The fluid channel 2 can have a layout forming a serpentine in the support 3. Therefore, the surface of the opening(s) in the support 3 of constant size can be increased, compared to typical linear layouts of microfluidic channels.

Figure 3D:
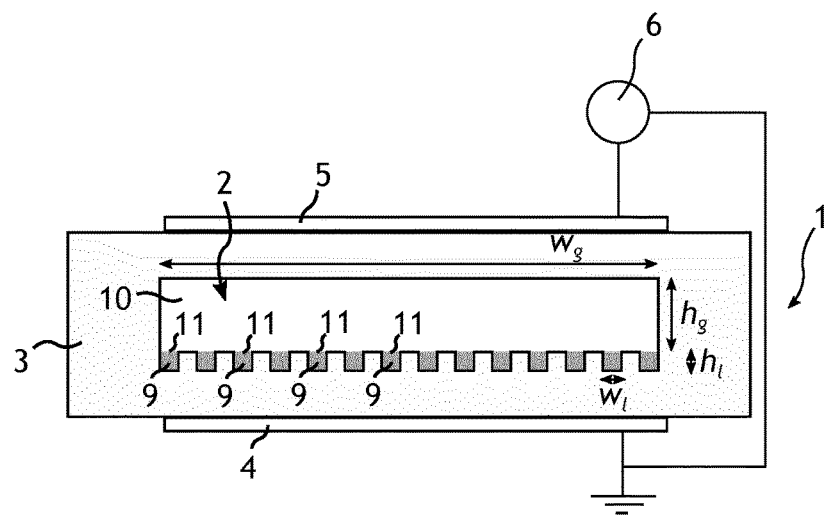

FIG. 3D illustrates schematically a different possible embodiment of the invention. The fluidic channel 2 can comprise a gas channel 10, at least partially surrounded by an array of liquid microchannels 9. Each liquid microchannel 9 is contiguous with the gas channel 10. An opening 11 is arranged between each liquid microchannel 9 and the gas channel 10 to cause the liquid 8 in the liquid microchannel 9 to contact the gas 12 in the gas channel 10, the liquid 8 flow being retained within the liquid microchannel 9 by capillarity action. The liquid microchannel 9 can be arranged so that at least one, and preferably two convex portions 7 define each opening 11 (the two liquid microchannels 9 at the extremities could be arranged with only one convex portion 7 defining the opening 11 as illustrated on FIG. 3D). Each of the convex portions 7 of an opening 11 is extending continuously along the length of the liquid microchannel 9 and of the gas channel 10.

The liquid microchannels 9 can form a two-dimensional array of liquid microchannels 9, and preferably of parallels liquid microchannels 9, each liquid microchannel being contiguous with the gas channel 10. The array can be arranged underneath the gas channel 10. Therefore, it is possible to parallelize the layout of the openings 11, so as to simplify the fabrication of the plasma reactor 1.

The height $h_l$ of the liquid microchannel 9 is advantageously comprised between 500 nm and 500 μm, notably between 2 μm and 200 μm and preferably between 5 μm and 100 μm. The height $h_g$ of the gas channel 10 is advantageously comprised between 500 nm and 1 mm, notably between 2 μm and 200 μm and preferably between 5 μm and 100 μm.

The width $w_l$ of the liquid microchannel 9 is advantageously comprised between 500 nm and 500 μm, notably between 2 μm and 200 μm and preferably between 5 μm and 100 μm. The width $w_g$ of the gas channel 10 is advantageously comprised between 2 μm and 10 mm, notably between 2 μm and 1 mm.

Figure 4A:
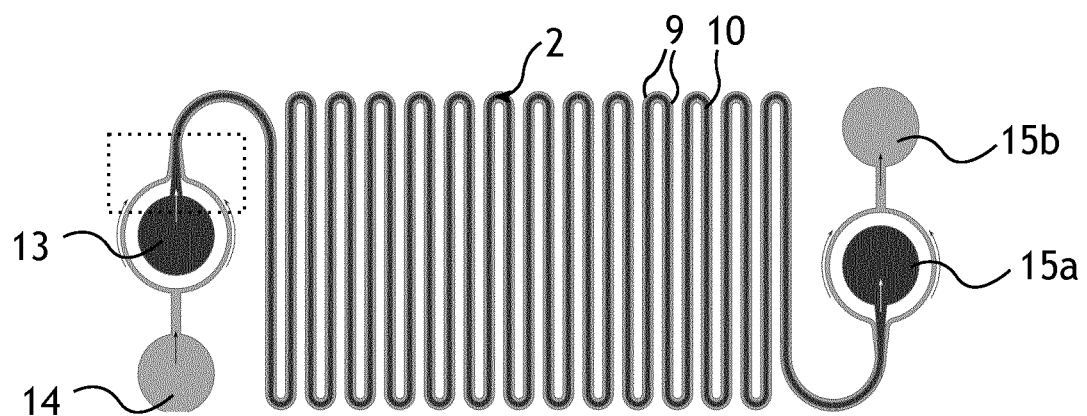
FIG. 4A and FIG. 4B illustrate a top view of a fluid channel in the plasma microreactor, FIG. 5 diagrammatically shows a general setup comprising the plasma microreactor.
Figure 4B:
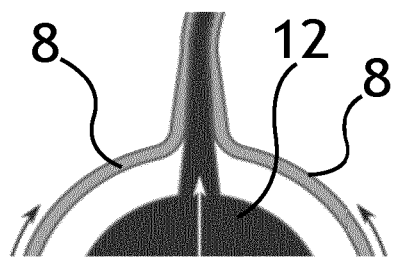

FIG. 4A and FIG. 4B illustrates a top view of a fluid channel 2 in the plasma microreactor 1. In FIG. 4, the liquid microchannels 9 and the liquid inlet 14 are illustrated in gray as the gas channel 10 and the gas inlet 13 are illustrated in black. The support 3 comprises a gas inlet 13, adapted to be connected to a gas reservoir, and a liquid inlet 14 adapted to be connected to a liquid reservoir. In a preferred embodiment, the liquid inlet can be divided into two channels, for example of equal hydrodynamic resistance, each of the two channels being connected to one of the liquid microchannels 9. Therefore, the liquid inlet 14 is adapted to provide the liquid 8 at equal flow rates into the liquid microchannels 9 arranged on opposite sides of the gas channel 10.

In a different embodiment of the invention (not shown), the support 3 can comprise a plurality of liquid inlets 14. For example, the support 3 can comprise two liquid inlets 14, adapted to be connected to two liquid reservoirs and respectively to two liquid microchannels 9. Therefore, different liquids 8 can be injected in two different liquid microchannels 9 in contact with the same gas channel 10.

The fluid channel 2 can be connected to a receiver, containing gas and/or liquid, by the means of a common fluid outlet (not illustrated) of the fluid channel 2. In a different embodiment, illustrated in FIG. 4, a liquid outlet 15a is connecting the liquid microchannel 9 to a liquid receiver, and a gas outlet 15b is connecting the gas channel 10 to a gas receiver. Therefore, the pressures at the end of the liquid microchannel 9 and at the end of the gas channel 10 can be tuned.

The fluid channel 2 is arranged following a main plan in a serpentine pattern. Therefore, the density of fluid channel 2 for a given surface can be optimized for a predefined microreactor surface. Particularly, the fluid channel 2 length, hence the liquid microchannel 9 length and/or the gas channel 10 length, can be higher than 2 cm, notably higher than 20 cm and preferably higher than 100 cm. This fluid channel 2 length can be higher than 1 m for example in a microreactor made of standard typical glass coverslips of 60 mm by 24 mm. Therefore, it is possible to increase the contact surface between the liquid 8 and the gas 12 for a predefined surface, and therefore to increase the efficiency of the plasma microreactor 1. Other patterns of fluid channel 2 can be used, in order to increase the density of fluid channel 2 in the main plane. Multiple parallel fluid channels 2 can be designed for instance. More generally, the surface density of fluid channel 2 in the main plane can be higher than 0.3 over a square of 20 mm$^2$ or more.

General Setup

Figure 5:
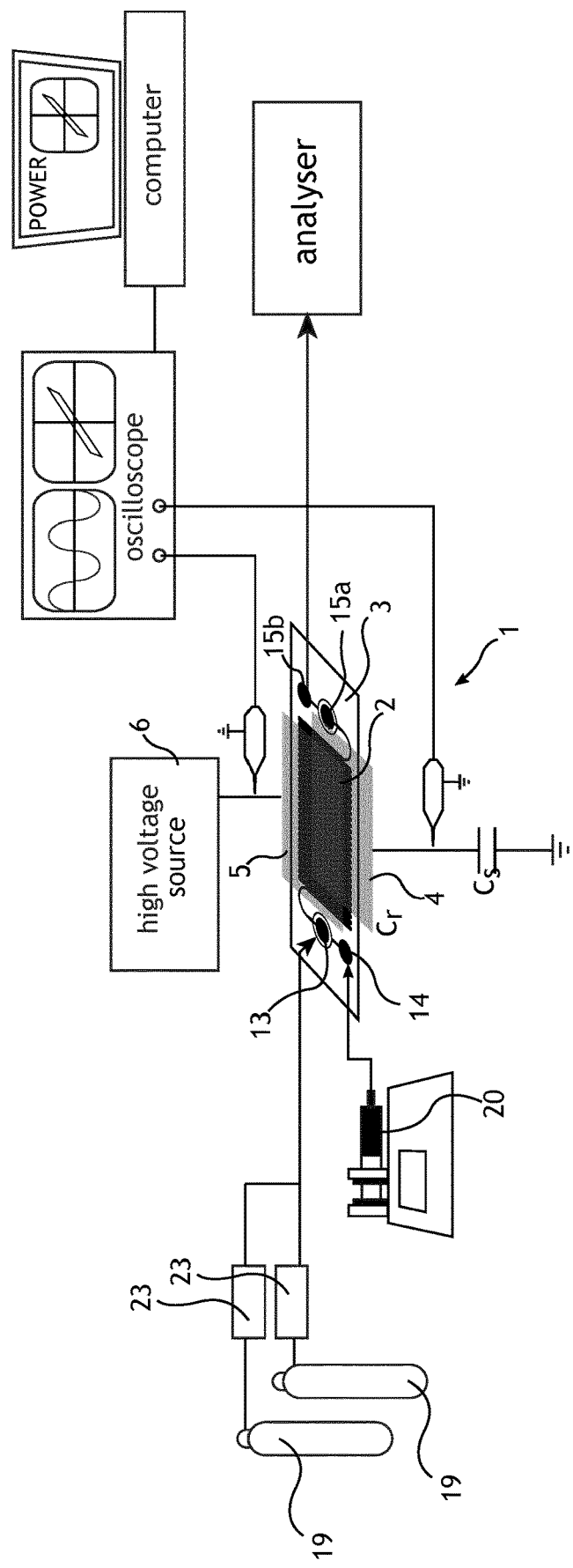

FIG. 5 diagrammatically shows a plasma microreactor 1 according to an embodiment of the present invention comprising a support 3 according to the embodiment illustrated on FIG. 2. The gas inlet 13 of the support 3 is connected to a gas reservoir 19, whereas the liquid inlet 14 of the support 3 is connected to a liquid reservoir 20. The liquid reservoir 20 can be for example a syringe. Other liquid reservoirs 20 can be used, depending on the type of liquid flow actuator coupled with the liquid reservoir 20. A liquid reservoir 20 comprising a pressurized gaseous phase can be used when using a pressure controller (for example a Fluigent MFCS pressure controller). A liquid reservoir 20 can also be fluidically connected to a peristaltic pump.

The liquid outlet 15b can be directly connected to an analyzer, in order to analyze the chemical species at the output of the plasma microreactor 1. The liquid outlet 15b can also be connected to another plasma microreactor 1 according to the present invention or not, so as to perform another synthesis step on the liquid issued from the plasma microreactor 1 for example. In another embodiment, the gas outlet 15a and the liquid outlet 15b can be connected to a common receiver.

The plasma microreactor 1 can be monitored by a computer, specifically adapted to monitor:

pressure controllers 23, which control the pressure of gas 12 upstream the plasma microreactor 1, a pressure controller and/or an automated syringe driver 20, which controls the pressure and/or the flow rate of the liquid 8 upstream the plasma microreactor 1, a high voltage source 6 which can be composed of various apparatuses such as a function generator, a signal amplifier, a fast high voltage switch, and an oscilloscope, and optionally an imaging system (not illustrated), such as an iCCD camera or a CCD camera, if need be, to visualize the flow shape or the electric discharges in the gas channel 10.

Flow Control

The plasma microreactor 1 is adapted to handle a liquid phase and a gas phase. For both of them, it is essential for the chemistry to control the flow rates and have access to their residence times. Thus, in a preferred embodiment, the liquid 8 flow is monitored by a syringe driver (kdScientific Legato 180). Other liquid flow actuator can be used, as pressure controller or a peristaltic pump. Mass flow rate controllers (Bronkhorst EL-FLOW) can be used to control the gas flow rate and realize gas mixtures. In a preferred embodiment, the gas flow rate through the gas channel 10 is higher than the liquid flow rate through the liquid microchannel 9, preferably between 5 times and 10000 times the liquid flow rate in the liquid microchannel 9, notably comprised between 50 times and 2000 times the liquid flow rate in the liquid microchannel, and preferably comprised between 80 times and 1000 times the liquid flow rate in the liquid microchannel. Therefore, it is possible to tune the residence time of the reactive species independently from the liquid flow rate in the liquid microchannel 9: the residence time of each phase is not correlated. The liquid 8 comprises at least a solvent and optionally at least a reagent. The flow rate of liquid 8 monitored by the syringe driver can be comprised in the range from 0.5 μL/min to 100 μL/min, notably from 1 μL/min to 50 μL/min and preferably from 4 μL/min to 30 μL/min. The gas used can be an inert gas (for example Ar, He, $N_2$) or an active gas ($O_2$, $H_2$, $CO_2$, CO, $NH_3$, volatile hydrocarbons such as $CH_4$) or a mixture thereof. The flow rate of gas 12 can be comprised in the range from 0.1 mL/min to 50 mL/min, notably from 0.5 mL/min to 10 mL/min.

Electrodes

The plasma microreactor 1 according to the invention comprises at least one ground electrode 4 and at least a high voltage electrode 5.

By "ground electrode" (also called earth electrode) is meant an electrode which is connected to the ground.

By "high voltage electrode" is meant an electrode which is connected to a high voltage source 6, the high-voltage source 6 being advantageously a source of high voltage between 250 V and 30 kV, notably between 1 kV and 20 kV, preferably between 1 kV and 10 kV.

The ground electrode(s) 4 and the high-voltage electrode(s) 5 are made with an electrical conductor material, such as indium (In), tin (Sn), copper (Cu), gold (Au), oxides and/or alloys thereof or mixtures thereof, in particular indium tin oxide (ITO), copper (Cu), gold (Au), chromium (Cr) or indium-tin alloy (In-Sn) or mixture thereof, more particularly ITO optionally in mixture with gold. The ground electrode(s) and the high-voltage electrode(s) can be made with an identical or different electrical conductor material.

The ground electrode(s) can be constituted with one or several ground electrode(s). Each ground electrode can have various forms, and extend over various parts of the fluid channel 2.

In the same way, the high-voltage electrode(s) can be constituted with one or several high-voltage electrode(s), extending over various parts of the fluid channel 2. The ground electrode(s) 4 and the high voltage electrode(s) 5 can have identical or different patterns. Therefore, as the electrode arrangement defines precisely where the plasma occurs in the gas channel 10, a chemical reaction can be initiated in a part of the fluid channel 2 surrounded by the ground electrode 4 and the high voltage electrode 5, and can occur in the other part of the fluid channel 2. Particular spatial pattern of the electrode 4.5 can therefore also be useful to alternate parts of the fluid channel 2 wherein the plasma can occur and other parts wherein reactive species created in the plasma can diffuse and react the liquid phase.

The design of a specific mask layer can also be drawn (not illustrated), corresponding to the ground electrode 4 or to the high voltage electrode 5, before the manufacture of the electrode. This mask can define for example a rectangular area adapted to cover the part of the gas channel 10 where a plasma discharge occurs. Therefore, uncontrolled discharge upstream or downstream is avoided, and a repeatable discharge volume in all the reactors is allowed.

FIG. 5 diagrammatically shows an upper view of the high-voltage electrode 5 and the ground electrode 4 extending respectively over and under the main plane in which is arranged the fluid channel 2 according to various embodiments of the invention. Other forms could however be envisaged. In a preferred embodiment, the ground electrode 4 extends over a plane on one side of said main plane, and the high voltage electrode 5 extends over another plane on the other side of said main plane. Therefore, the discharge in the gas channel 10 can be homogeneous, and the reactivity of the gas phase can also be homogeneous.

In a preferred embodiment, the high voltage electrode 5 and the ground electrode 4 are respectively deposited on opposite faces of the support 3, for example over and under the support 3. In another preferred embodiment, at least one of the ground electrode 4 and the high voltage electrode 5 can be embedded in the support 3. In all the embodiment of the invention, at least one of the ground electrode 4 and the high voltage electrode 5 is separated from the fluidic channel 2 by a dielectric material.

In a preferred embodiment, the distance between the high-voltage electrode(s) 5 and the ground electrode(s) 4 is comprised between 10 µm and 10 mm, notably between 50 µm and 5 mm and preferably between 500 µm and 2 mm. Smaller distances are preferred, notably between 500 µm and 1000 µm, in order to have a low breakdown voltage which is less energy-consuming. This distance depends also on the height of the gas channel 10, which is present between the ground electrode 4 and the high voltage electrode 5.

Figure 6:
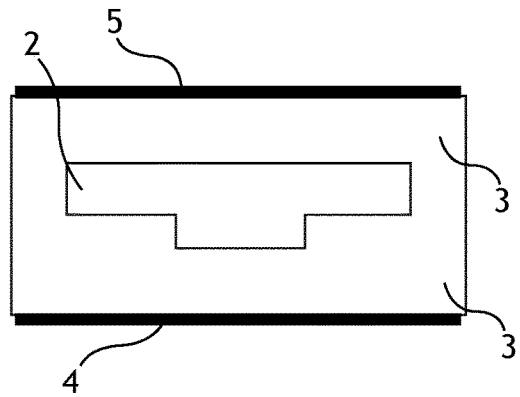
FIG. 6 illustrates a double dielectric barrier discharge configuration of the electrodes.

In reference to FIG. 6, in a preferred embodiment, the ground electrode 4 and the high voltage electrode 5 can be arranged in a double dielectric barrier discharge configuration (double-DBD). Therefore, electrode sputtering by the plasma can be avoided.

Figure 7:
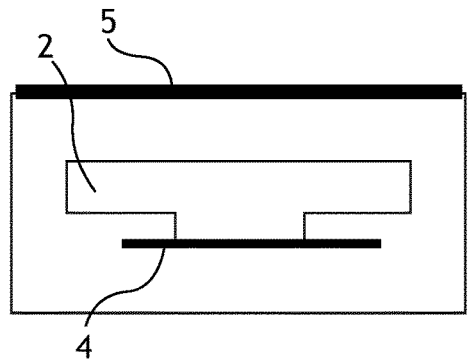
FIG. 7 illustrates a single dielectric barrier discharge configuration of the electrodes.

In reference to FIG. 7, the ground electrode 4 and the high voltage electrode 5 can be arranged in a single dielectric barrier discharge configuration (mono-DBD).

Electrical Connections

The high voltage electrode 5 and the ground electrode 4 are respectively connected to a high voltage source 6 and to the ground. In preferred embodiments, the high voltage source 6 can provide sinusoidal waves of potential or a pulsed potential.

Sinusoidal waves are generated by a function generator and magnified by a signal amplifier (Trek, 20/20C) to several thousands of volts, optionally in the range from 500 V peak to peak to 20 000 V peak to peak, preferably in the range from 1 000 V peak to peak to 10 000 V peak to peak. The frequency of a wave can vary from 50 Hz to 5 kHz. This range can be limited by the slew rate of the amplifier and/or by the behavior of the discharge in the plasma microreactor 1 (transport of species, diffusion, kinetics of the targeted chemical reactions, etc.).

High voltage pulses are produced by a pulsed generator, made of a DC high voltage generator (Spellman UM Series) coupled with a fast high voltage switch (Behlke HTS Series). It produces 100 ns-wide pulses of up to ±10 kV.

Manufacture of the Plasma Microreactor

Figure 8:
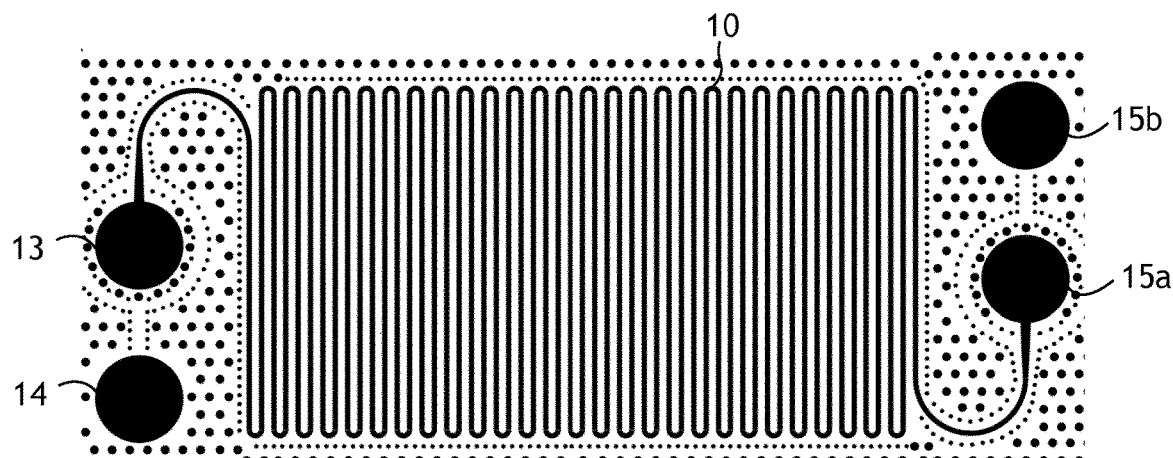
FIG. 8 and FIG. 9 illustrate the designs of masks for the manufacture of two layers of the plasma microreactor according to a possible embodiment of the invention.
Figure 9:
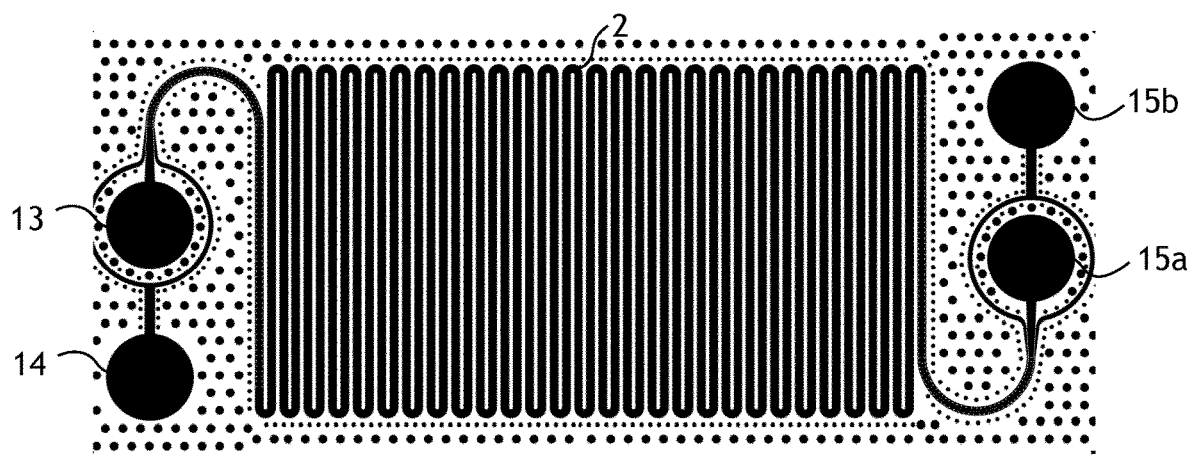

In reference to FIG. 8 and FIG. 9, the fluid channel 2 is designed as a serpentine-patterned channel whose cross-section is illustrated in the abovementioned embodiments, for example in FIG. 2. FIG. 8 and FIG. 9 illustrate the designs of the masks for the manufacture of respectively the first layer L1 and the second layer L2 of the plasma microreactor 1. The designs are drawn with a 2D computer-assisted design software (Clewin5).

In reference to FIG. 10A, FIG. 10B, FIG. 10C, FIG. 10D and FIG. 10E, a PDMS mold 103 is manufactured.

Figure 10A:
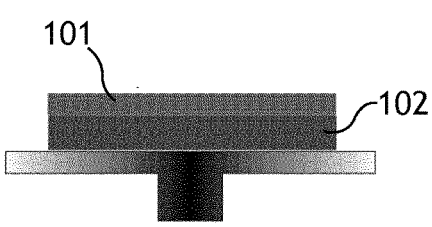
FIG. 10A, FIG. 10B, FIG. 10C, FIG. 10D and FIG. 10E illustrate the manufacture of a part the plasma microreactor according to a possible embodiment of the invention.

In reference to FIG. 10A, negative photoresist 101 (SU8 2035, purchased from MicroChem®) is spin-coated at 3500 RPM during 30 s over a silicon wafer 102, to obtain a 30 µm thick layer.

Figure 10B:
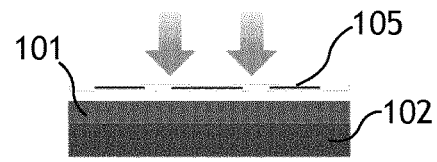

In reference to FIG. 10B, the photoresist layer is insolated for 5.5 sec at 40 mW/cm² in a mask aligner (UV-KUB3 Mark Aligner from KLOE® company) through a mask 105 corresponding to the first layer L1 (as illustrated notably in FIG. 8), then soft baked for 1 min 65° C. and then for 6 min at 95° C. The insolated parts of the photoresist layer undergo a chemical reaction which toughens them. After the soft bake, a second layer of photoresist is spin-coated onto the first layer at 2500 RPM during 30 s to yield a 50 µm thick layer. The same procedure as before is repeated with a mask 105 corresponding to the second layer L2 (as illustrated notably in FIG. 8), aligned with the distinguishable shapes of the first layer. After the second soft bake, the substrate 102 and photoresist layers are developed during 7 min in a bath of 1-methoxy-2-propanol acetate (Microposit®) to remove the unreacted parts of the photoresist layer.

Figure 10C:

In reference to FIG. 10C, this procedure makes possible to provide a positive mold 104 having at least the shape of the forecasted fluid channel 2.

Figure 10D:
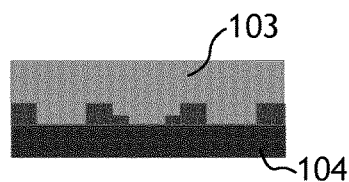

In reference to FIG. 10D, a mixture of liquid PDMS (RTV, room temperature vulcanizing polydimethylsiloxane) and cross-linking agent is poured over the positive mold 104, and cross-linked at 70° C. for 1 hour.

Figure 10E:
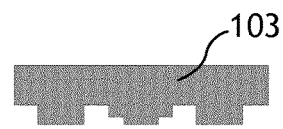

In reference to FIG. 10E, the crosslinked PDMS layer is peeled off the positive mold 104 to provide the PDMS mold 103. The positive PDMS mold 103 is then used to fabricate the plasma microreactor 1, comprising two 150 µm-thick D 263 M glass coverslips (Menzel-Glaser, 24×60 mm), between which NOA-81 (Norland Optical Adhesive) resist will build the walls of the fluid channel 2.

FIG. 11A, FIG. 11B, FIG. 11C, FIG. 11D and FIG. 11E illustrate diagrammatically the manufacture of electrode-bearing coverslips by a lift-off process.

Figure 11A:
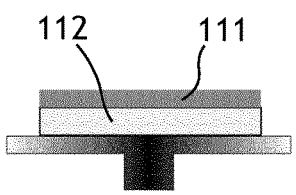
FIG. 11A, FIG. 11B, FIG. 11C, FIG. 11D and FIG. 11E illustrate the manufacture of electrode-bearing coverslips by a lift-off process according to a possible embodiment of the invention.

In reference to FIG. 11A, positive photoresist 111 (S1818, Microposit®) is spin-coated over the coverslip 112.

Figure 11B:
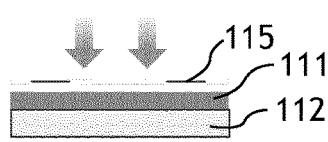

In reference to FIG. 11B, the photoresist 111 is UV-insolated for 11 sec at 23 mW/cm² through a mask 115 corresponding to an electrode, then baked 1 min at 65° C. and 2 min at 115° C.

Figure 11C:
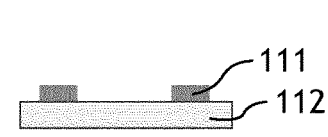

In reference to FIG. 11C, the photoresist 111 is developed in a bath of photoresist developer (MF-319 Microposit®). The photoresist 111 stays only on the parts which were not insolated, protecting the underlaying glass where the electrode should not be.

Figure 11D:
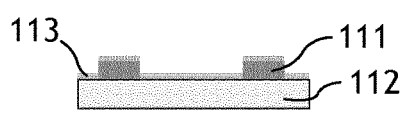

In reference to FIG. 11D, the coverslip is introduced in a magnetron sputtering deposition system (Plasmionique®) operating with one target of ITO and one target of gold. After an oxygen plasma cleaning step, the deposition process follows the steps of: pure ITO deposition, mixed Au-ITO deposition, pure ITO deposition tso form the Au-ITO layer 113. The addition of gold in the ITO film enhances its conductivity by a factor of 100 after thermal annealing 2h at 400° C. in air. The final thickness of the deposited thin film is approximatively 70 nm.

Figure 11E:
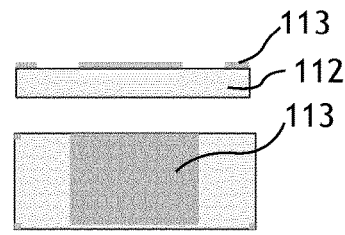

In reference to FIG. 11E, the photoresist 111 is removed together with parts of the target material covering it, for example using a bath of acetone.

Figure 12A:
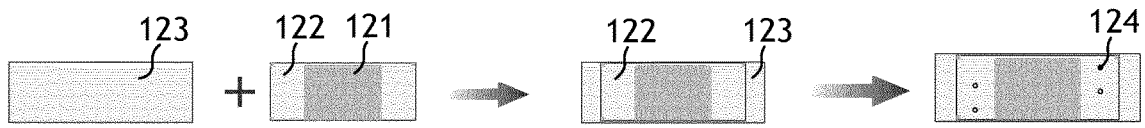
FIG. 12A illustrates the manufacture of the plasma microreactor according to a possible embodiment of the invention.

Referring to FIG. 12A, the electrode side 121 of the first coverslip 122 is electrically connected to a band of aluminum foil through silver paint (not illustrated), then glued, for example with NOA, to a 1 mm thick glass slide substrate to ensure the robustness of the chip. Inlet and outlet bores 124 are drilled all the way through this assembly.

Figure 12B:
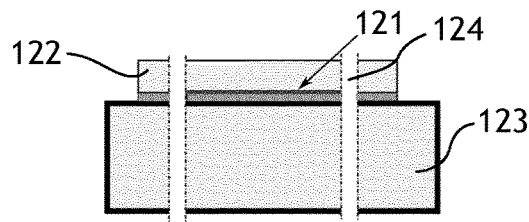
FIG. 12B illustrates a cross section view of the plasma microreactor according to a possible embodiment of the invention.

FIG. 12B illustrates a cross view section of the assembly made of the glass slide substrate 123 glued to the first coverslip 122 on this electrode side 121 with bores 124.

Figure 13A:
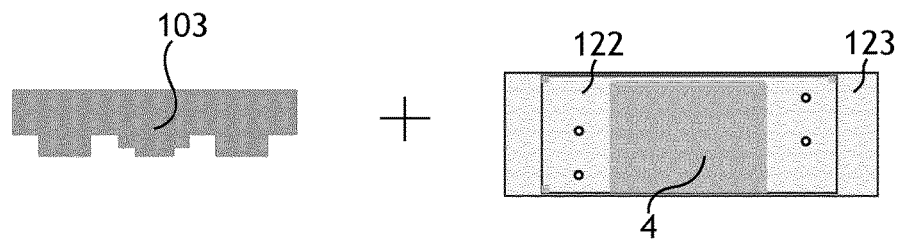
FIG. 13A, FIG. 13B, FIG. 13C and FIG. 13D illustrate the manufacture of the plasma microreactor according to a possible embodiment of the invention.

Referring to FIG. 13A, the negative PDMS mold 103 is laid onto the bare side of the first coverslip 122. Therefore, the electrode (for example the ground electrode 4) can be separated from the fluid channel 2 by the glass of the coverslip 122 which is a dielectric material.

Figure 13B:
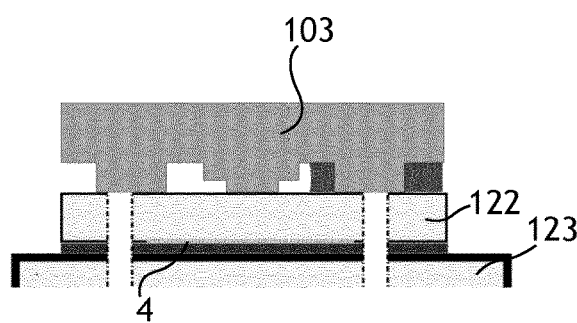

Referring to FIG. 13B, liquid NOA-81 drops are deposited around the mold 103. The NOA-81 is a thiol-ene based, UV-curable resin. It has been chosen as a micromachining material over traditionally used PDMS (polydimethylsiloxane) for its good physical, chemical, electrical and optical properties, most of them being detailed in [7]. Therefore, unlike PDMS microreactors, NOA-81 microreactors are impermeable to gas such as air and water vapor, which ensures a closed environment for plasma and chemical reactions. Moreover, cured NOA-81 has a high elastic modulus (typically 1 GPa), which avoids sagging effects. NOA-81 appears less sensitive to solvent swelling effects than PDMS. The dielectric constant of NOA-81 being 4.05 at 1 MHz and 6.5 at 1 kHz, it is as a performant insulating material than PDMS. With a high transmittance in the visible and near-UV range, NOA-81 makes it possible for in situ discharge diagnostics (Optical Emission Spectroscopy (OES) or ultra-rapid camera measurements). Owing to these properties, NOA-81 is a good candidate for the manufacture of the plasma microreactor 1.

The liquid is driven between the glass of the first coverslip 122 and the PDMS mold 103 by capillary forces until it fills completely the open parts of the microstructure. During that steps, the array of circular shapes seen on the masks 105, illustrated in FIG. 8 and in FIG. 9, act as pillars to prevent the PDMS mold 103 from collapsing where there is no channel part to put it in contact with the rigid glass.

Figure 13C:
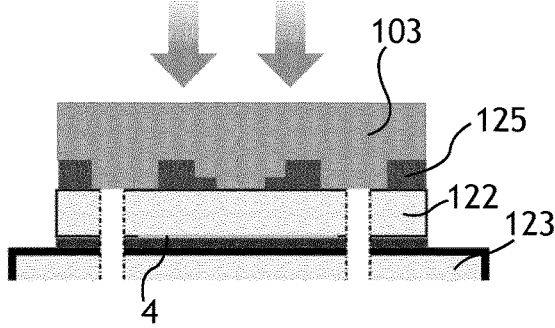

Referring to FIG. 13C, a short treatment with UV light is then used to obtain a partially insulated NOA-81 microstructure 125 which keeps a thin layer of uncured liquid on its surface.

Figure 13D:
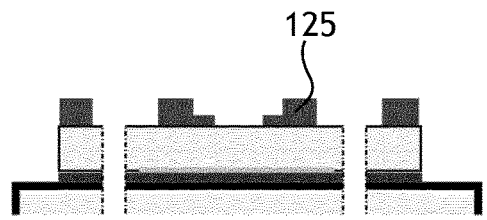

Referring to FIG. 13D, the PDMS mold 103 is then carefully removed from the microstructure 125.

Figure 14A:
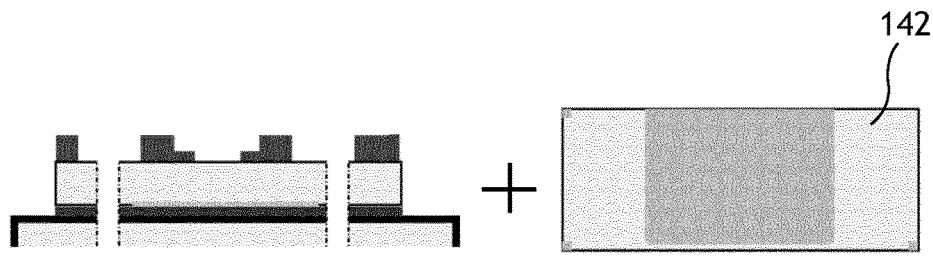
FIG. 14A and FIG. 14B illustrate the manufacture of the plasma microreactor according to a possible embodiment of the invention.
Figure 14B:
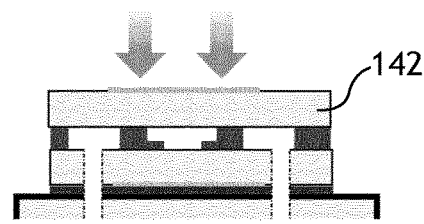

Referring to FIG. 14A and FIG. 14B, the bare side of a second glass coverslip 142, is homogeneously pressed on the structure. A treatment with UV light ends the curing process.

Figure 15A:
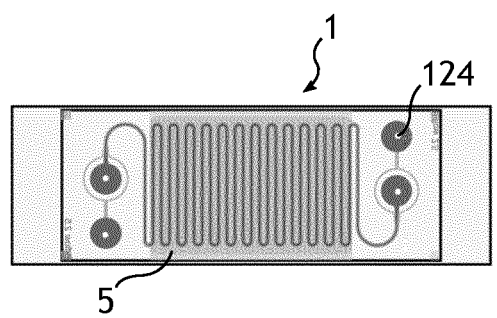
FIG. 15A and FIG. 15B illustrate the plasma microreactor according to a possible embodiment of the invention, FIG. 16 illustrate an electrical characterization of the plasma microreactor made by the Lissajous method.
Figure 15B:
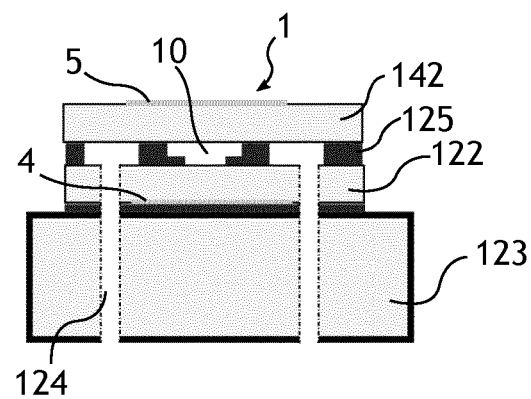

Referring to FIG. 15A and FIG. 15B, an electric connection with the electrode of the second coverslip (for example the high voltage electrode 5) is made with an aluminum foil, and connectors (for example Nanoports® connectors) are glued to the bores 124. The electrodes 4,5 face each other in a plane-to-plane configuration. Particularly, the ground electrode 4 and the high voltage electrode 5 are arranged in a double-DBD configuration: both electrodes are separated from the plasma zone, i.e. from the gas channel 10 by an insulating layer. In another embodiment, a single-DBD can be fabricated by fabricating the ground electrode 4 directly one the glass slide substrate 123 and fabricating the microstructure 125 directly on the surface of the substrate 123 where the ground electrode 4 is deposited.

An optical diagnostic can be performed with an optical transmission imaging setup by using a transparent ITO ground electrode 4 and a transparent ITO high voltage electrode 5. In another embodiment, the ground electrode 4 can be made in an opaque material, for example in Cr/Au. Imaging the light emitted by a plasma discharge is therefore possible using one transparent electrode. If none of these diagnostics are required, both electrodes can be made out of regular, cheap and/or opaque metals.

Power Assessment

Figure 16:
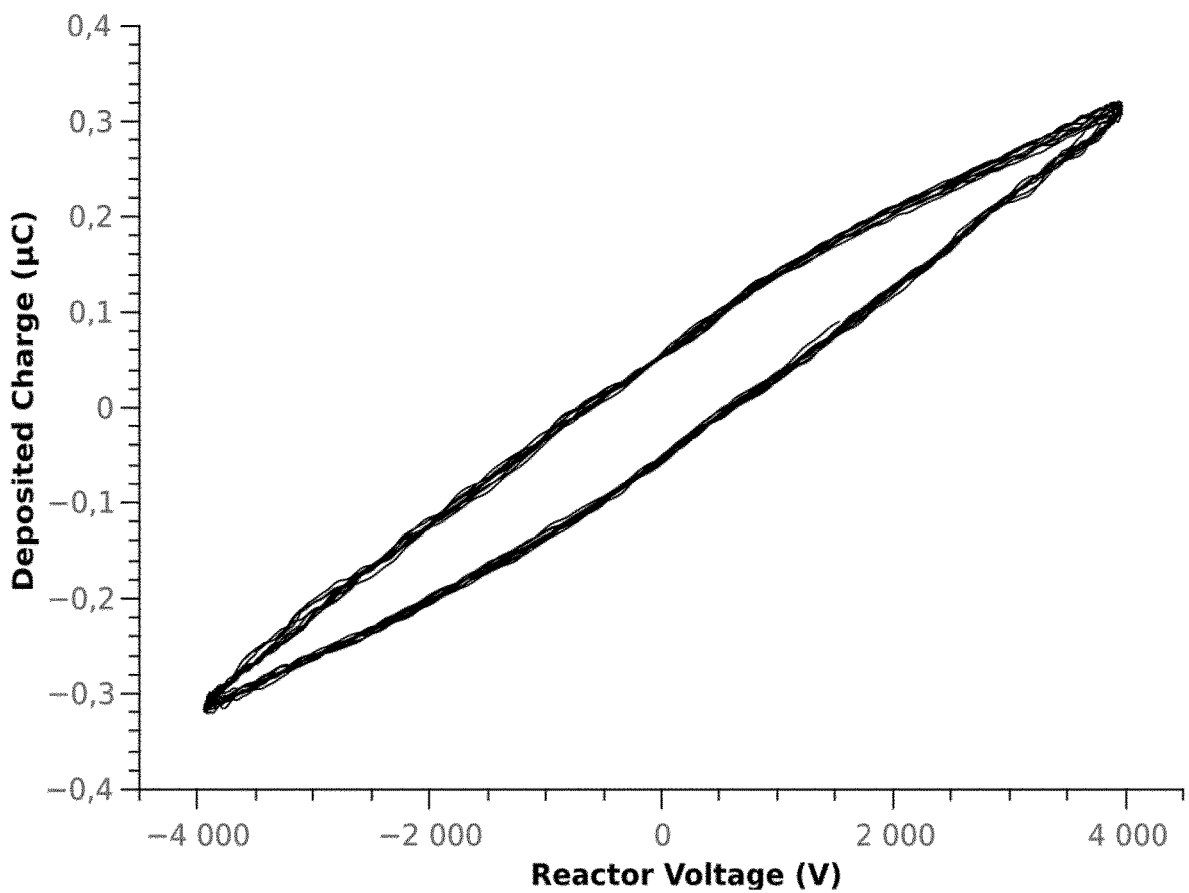

In reference to FIG. 16, the electrodes 4,5 can be polarized by a sine wave potential. The electrical characterization is made by the Lissajous method. A 3.2 nF capacitor is connected in series between the ground electrode 4 and the ground, and the voltage drop across both the high voltage electrode 5 and across the capacitor are measured with adapted voltage probes (LeCroy PPE 20 kV, 1000:1, 100 MHz; Teledyne LeCroy PP024 10:1 500 MHz) with an oscilloscope (Teledyne Lecroy WaveSurfer10, 1 GHz) connected to a computer.

In the absence of any plasma discharge, the plasma microreactor 1 acts as a capacitance. Therefore, the measured voltages are in phase because the equivalent electrical circuit is equivalent to two capacitances in series. This behavior is measured by a straight line displayed by the oscilloscope in XY mode.

When plasma discharges occur, small amounts of charges come across the plasma in the gas channel 10 and are deposited on the capacitance. This deviation from the pure capacitive behavior of the reactor proves the presence of discharges and can be measured when the oscilloscope displays a parallelogram-shaped XY image.

Moreover, since the voltage drop across the capacitance is proportional to its charge, the area of the parallelogram readily gives us the energy transferred to the reactor during one period, as illustrated in FIG. 16.

In another embodiment, the electrodes 4,5 can be polarized by a pulsed high voltage. A high voltage probe (Keysight 10076 C voltage probe, 4 kV, 500 MHz or LeCroy PPE 20 kV, 1000:1, 100 MHz) provides with the voltage drop across the plasma microreactor 1 while a current probe (Pearson current probe, model 2877, 200 MHz) placed between the micro-reactor and the ground gives the total electrical current (capacitive+discharge) flowing through the plasma microreactor 1. The capacitive current being the derivative of the voltage, the discharge current can be extracted from the total current and the energy deposited into the plasma microreactor 1 can be calculated.

Optical Detection

A charge-coupled device (CCD) camera (Pixelink PL-B781U) can be mounted on a macroscope (Leica Z16 APO) and image the fluid flow inside the plasma microreactor 1. The plasma microreactor 1 can be back-illuminated by a diffuse LED lamp. Therefore, the stability of the collinear gas/liquid flow can be evaluated and the liquid 8 and gas 12 flow rates can be tuned.

Figure 17:
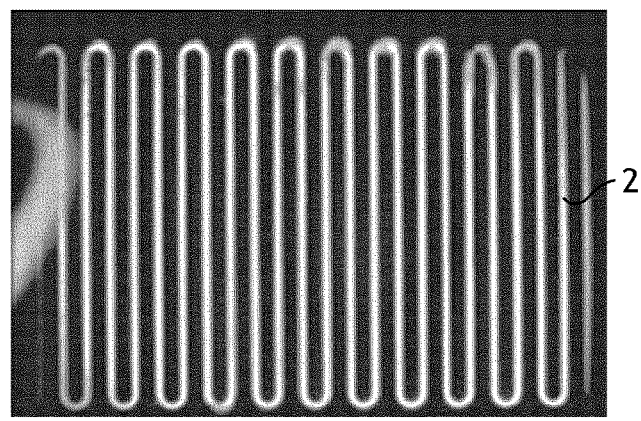
FIG. 17 is a top view image of the plasma microreactor.

FIG. 17 is a top view image of the plasma microreactor 1. An intensified charge-coupled device (iCCD) camera (Pimax4, Princeton Instruments) was triggered by the function generator to collect images of plasma discharges through a macroscope (Leica Z16 APO). A dark environment is necessary for the detection of weak optical emission of electrical discharges, due to the small volume concerned. FIG. 17 illustrates the light emitted by the plasma homogeneously all along the gas channel 10 when a discharge is triggered while cyclohexane and argon are flowing contiguously: cyclohexane liquid 8 in the liquid microchannel 9 and argon gas 12 in the gas channel 10.

FIG. 18A and FIG. 18B are top view images of the plasma microreactor 1. In reference to FIG. 18A, plasma discharges are imaged in a T-shaped fluid channel 2. A gas 12 flows in the entire fluid channel 2, i.e. both in the liquid microchannel 9 and in the gas channel 10. Therefore, the difference of height between the liquid microchannel 9 and the gas channel 10 can be measured through a difference of intensity in the plasma discharges image.

In reference to FIG. 18B, a liquid 8 flows in the liquid microchannel 9 and a gas flows in the gas channel 10. Therefore, plasma discharges are only visible in the gas channel 10.

Plasma Enhanced Chemical Synthesis

The above described plasma microreactor 1 is adapted to generate a plasma in contact with a fluid phase. A method for generating a plasma in a plasma microreactor (1), comprises the steps of:

(a) providing the plasma microreactor 1,
(b) providing a liquid 8 and making the liquid flow through the liquid microchannel(s) 9 in a given direction,
(c) providing a gas 12 and making the gas flow through the gas channel 10 in said direction,
(d) applying a high voltage between the high voltage electrode(s) 5 and the ground electrode(s) 4 so as to generate a plasma in the gas channel 10. As the control of the liquid flow and the gas flow are independent, it is possible to tune the residence time of the liquid phase and of the gas phase, and for example having different a liquid flow rate and a different gas flow rate.

EXAMPLES

Example 1

Stabilization of the Flows

FIG. 19 illustrates a flow of water and a flow of argon, controlled in two different types of fluid channels: a fluid channel 2 comprising two convex bended portions 7 according to the embodiment illustrated in FIG. 2 ("with a step"), and in a flat fluid channel different the invention ("without a step"), for varying gas flow rates from 0.5 mL/min to 2 mL/min. Therefore, without convex bended portions 7, no stable biphasic flow can be achieved, and the flow is a plug flow or scattered water droplets which randomly move onwards. The fluid channel 2 comprising convex bended portion 7 allows gas 12 to flow through the liquid 8.

More generally, the behaviors of cyclohexane and water flows are dependent on the respective affinities of cyclohexane and water for glass and NOA. Whereas cyclohexane has a similar affinity for glass (contact angle) ~10° and NOA (contact angle) ~6° which are the two materials of the fluid channel 2 walls, water only barely wets NOA (contact angle with water) ~65°. These contact angles were measured with a drop shape analyzer (Kriiss analyzer). The wettability of the plasma microreactor 1 material has to be taken in consideration when designing the plasma microreactor 1 for chemical reaction comprising a predefined liquid phase.

Example 2

Oxidation of Cyclohexane

Liquid cyclohexane (VWR, HiPerSolv CHROMANORM for HPLC) was introduced at three different flow rates (6 µL/min, 12 µL/min and 24 µL/min) in the plasma microreactor 1 together with pure $O_2$ gas at respectively 0.5 mL/min, 1.5 mL/min and 2 mL/min (sccm). A high voltage, a 2 kHz sine wave potential triggers atmospheric pressure dielectric barrier discharges in the gas channel 10. The amplitude of the potential was adapted to get a constant power of 500 mW, as measured thanks to the aforementioned electrical setup, and was controlled to be measured being between 6 kV and 7 kV peak to peak.

The outflowing mixture of liquid 8 and gas 12 was led together though a PTFE tube into a vial immersed in an 8° C. water bath. A second tube connected to the vial served as an exit for the gas 12. The cold bath reduces the stripping of the volatile cyclohexane, which affects the assessment of final conversion. Experiments with known amounts of pure cyclohexane flowing at 6 µL/min and argon gas at 1 mL/min in the same recovering conditions indeed showed a loss of 14±5% of cyclohexane, whereas a loss of sensibly 30% cyclohexane was measured without the cold bath. The temperature of 8° C. was chosen to be slightly above the melting temperature of cyclohexane ($T_m$=6.47° C.). Indeed, when a 0° C. ice bath is used, the liquid flowing out of the tube inside the vial freezes and clogs the end of the tube. Without this temperature control, pressure rises inside the plasma microreactor 1, owing to the inflowing gas rate until the stress limits of the reactor which then debonds itself, leaks and is definitely unusable.

The analysis of the liquid 8 was performed by GC-MS/FID (Agilent, 7890B GC+5977B MSD). The chromatographs showed three main products, one secondary product and a lot of traces. Two of the main products were positively identified as cyclohexanol and cyclohexanone, and the secondary product as being cyclohexene. The third major product was thought to be cyclohexyl hydroperoxide, which was indirectly proven by two elements. Firstly, band test of the hydroperoxide function was carried out on the cyclohexane before and after passing through the plasma microreactor 1, and gave positive result only in the latter case. Secondly, $NaBH_4$ reduction of the outflowing liquid has been carried out, and the comparison of the corresponding chromatographs showed a disappearance of the unknown peak, while the cyclohexanol peak was increased. This is coherent with the reduction of cyclohexyl hydroperoxide into cyclohexanol.

The three products cyclohexanol, cyclohexanone and cyclohexyl hydroperoxide actually stem from the same reaction chain and can be easily turned into one product (cyclohexanol, by reduction). The products are usable for industrial purposes. The mixture cyclohexanol/cyclohexanone is indeed known as "KA oil" and used as precursor of nylon. Therefore, it was chosen to count these products together when calculating the selectivity of the reaction.

Figure 20:
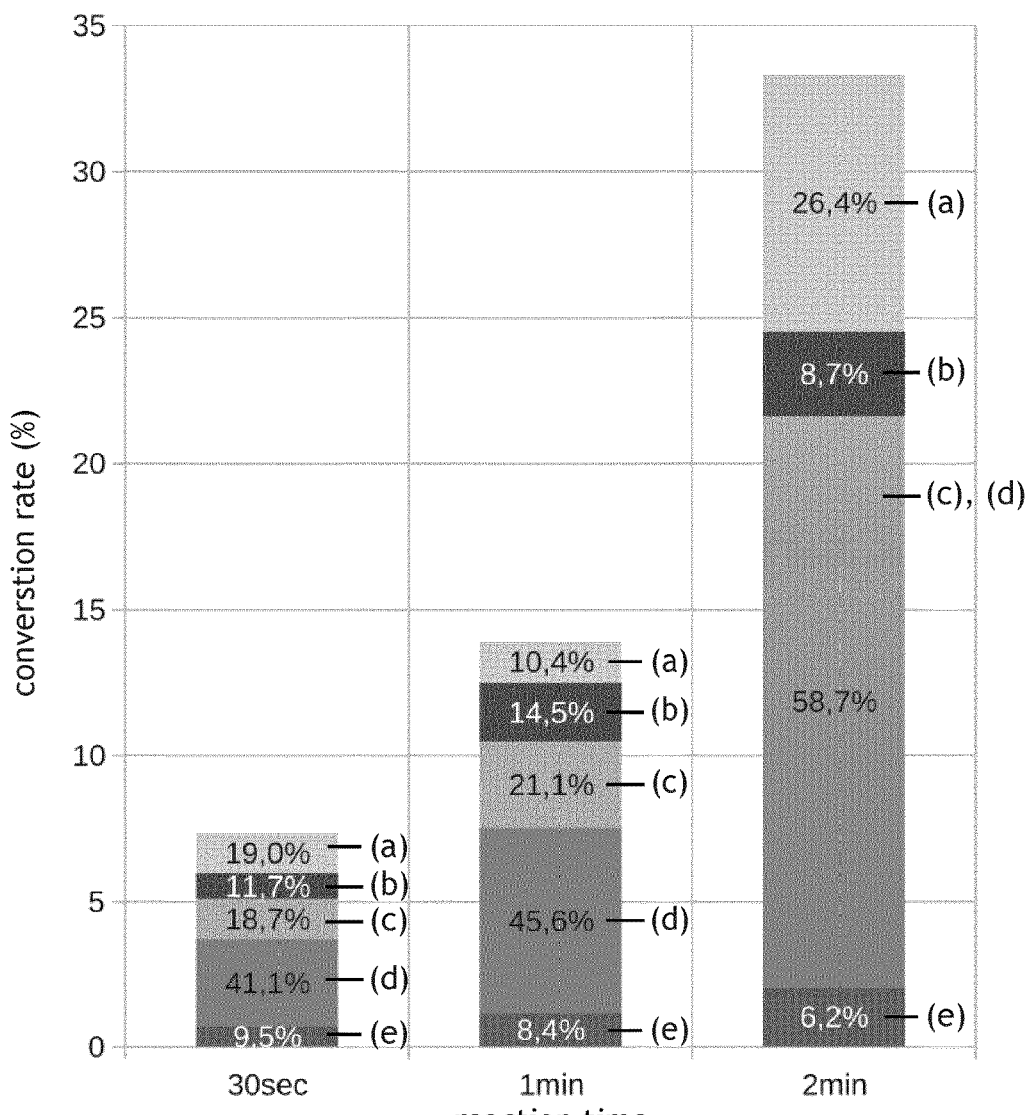
FIG. 20 illustrates the molar fraction of compounds in the output liquid, in percentage.

FIG. 20 illustrates the molar fraction of compounds in the output liquid 8. For each reaction time (30 sec, 1 min and 2 min), the portions (a) of the diagram illustrate the proportion of unknow compounds, the portions (b) of the diagram illustrate the proportion of cyclohexyl hydroperoxide, the portions (c) of the diagram illustrate the proportion of cyclohexanone, the portions (d) of the diagram illustrate the proportion of cyclohexanol and the portions (e) of the diagram illustrate the proportion of cyclohexene. Therefore, a partial oxidation of cyclohexane was performed in the plasma microreactor 1, and no over-oxidation was detected.

Table 1 illustrates the selectivity of the conversion and the proportion of converted cyclohexane (total conversion) for three different reaction times in the plasma microreactor 1.

TABLE 1

| Reaction time | Selectivity | Total conversion |
| --- | --- | --- |
| 30 sec | 71% | 7% |
| 1 min | 81% | 14% |
| 2 min | 67% | 32% |

Example 3

Variation of the Reactants

Other gases 12 can be used to perform a chemical reaction as described in the example 2. The use of pure hydrogen gas 12 on cyclohexane in the plasma microreactor 1 produces cyclohexene as the main product, which is unexpected since it proves a dehydrogenation reaction. Cyclohexene selectivity varies from 17% to 35%, decreasing with the increasing overall conversion. A significant amount of the by-products is thought to stem from the overreaction of cyclohexene which, owing to its double bond, is more reactive than cyclohexane. Table 2 illustrates possible reactions to be performed in the plasma microreactor 1 according to the provided type of gas.

TABLE 2

| Type of gas | Possible reactions |
| --- | --- |
| Ar/He | Bond breaking (not selective) |
| | Enhancing the reactivity of active gases (by helping energy transfers) |
| $O_2$ | Partial oxidation |
| | Total oxidation |
| $H_2$ | Hydrogenation |
| | Dehydrogenation |
| $NH_3$ | Amination |
| $N_2$ | Bond breaking (not selective) |
| | Amination (with $H_2$) |
| $CO/CO_2$ | Carbonylation |

Example 4

Variation of the Design of the Liquid and Gas Microchannels

A microreactor was manufactured in Borofloat® 33 glass according to the geometry depicted on FIG. 3D. The fabrication steps included plasma etching of two glass plates and their subsequent bonding. In a globally serpentine-shaped channel, the liquid flow was lead by a dozen of 40 μm×40 μm parallel grooves on one of the 1 mm-wide sides of the channel, and the gas flow allowed to flow in the above 300 μm-high channel space.

Figure 21:
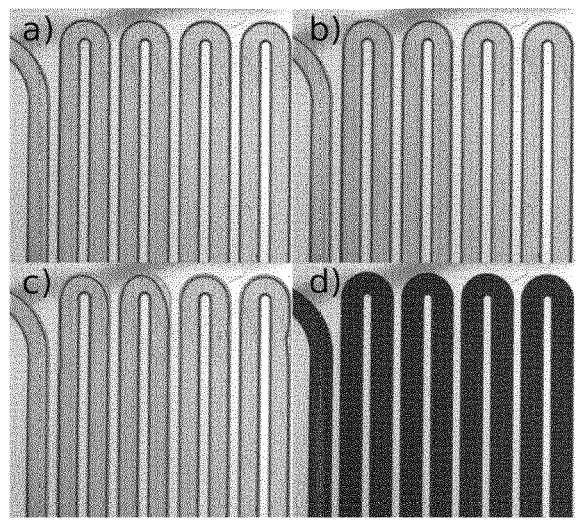
FIGS. 21, 22, 23 and 24 illustrate a gas flow and a liquid flow in a plasma microreactor according to a possible embodiment of the invention.

FIG. 21 shows pictures of the channel taken in transmission for various flow rates. When empty (FIG. 21d), the channel appears dark because of the granularity of the plasma-etched glass surface which scatters light. When covered by a liquid layer, the surface is smoothed, the light scattering is reduced and the picture becomes lighter. The presence of a liquid flow is then assessed by the brightness of the picture. In FIGS. 21a, 21b and 21c the flow rates were the following: 20 ml/min of oxygen gas, and 25, 30 and 35 μl/min of liquid cyclohexane, respectively.

Figure 22:
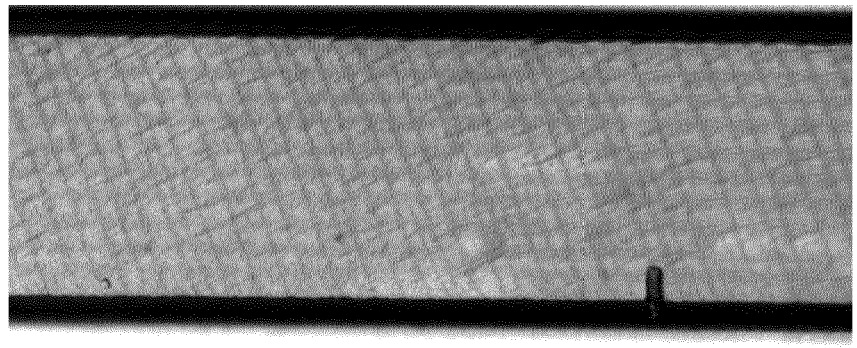

Although the groove-like structure of the channel remains unseen with this setup, one can clearly see the difference between two areas: the centre of the channel and its edge (brighter, only on FIGS. 21b and 21c). The latter reveals a liquid flow taking the full channel height. In contrast, the first is therefore only a thin layer of liquid which only wets the bottom of the channel, thanks to the groove-like structure. Zooming onto the channel allows one's careful eye to guess this structure (FIG. 22, with 10 ml/min oxygen flow rate and 20 μl/min cyclohexane flow rate).

Two comb-shaped copper electrodes were then deposited on both sides of the chip to allow direct optical visualisation. A plasma was triggered by a 2 kHz 20 kV peak-to-peak sine high voltage between these electrodes.

Figure 23:
Figure 24:
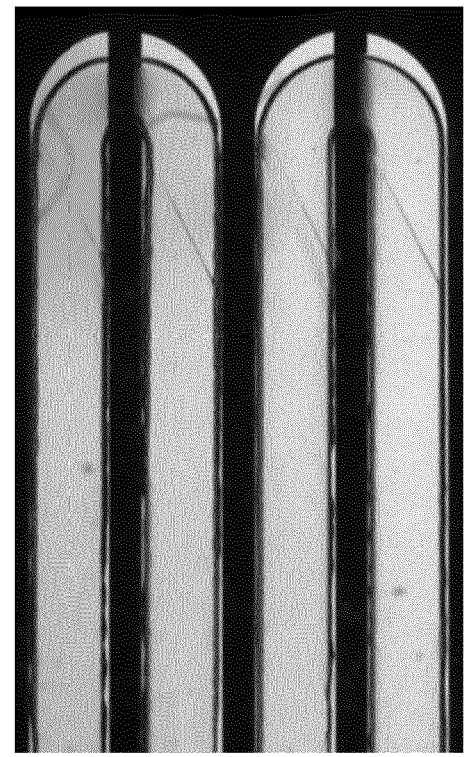

FIGS. 23 and 24 show a 20 ml/min oxygen and 300/min cyclohexane biphasic flow, with the plasma enabled. The liquid flow is well confined inside the grooves. An GC-FID analysis of the out-flowing liquid gave a 5.9% conversion and a 83% selectivity in (cyclohexanol+cyclohexanone+cyclohexyl hydroperoxide).

REFERENCES

[1] Malik, M. A. (2010). Water purification by plasmas: Which reactors are most energy efficient?, *Plasma Chemistry and Plasma Processing,* 30(1), 21-31.

[2] Yano, T., Uchiyama, I., Fukawa, F., Teranishi, K., & Shimomura, N. (2008, May). Water treatment by atmospheric discharge produced with nanosecond pulsed power. In *IEEE International Power Modulators and High Voltage Conference, Proceedings of the* 2008 (pp. 80-83). IEEE.

[3] Matsui, Y., Takeuchi, N., Sasaki, K., Hayashi, R., & Yasuoka, K. (2011). Experimental and theoretical study of acetic-acid decomposition by a pulsed dielectric-barrier plasma in a gas-liquid two-phase flow. Plasma Sources Science and Technology, 20(3), 034015.

[4] Zhang, M., Ognier, S., Touati, N., Binet, L., Thomas, C., Tabeling, P., & Tatoulian, M. (2017). The development and numerical simulation of a plasma microreactor dedicated to chemical synthesis. Green Processing and Synthesis, 6(1), 63-72.

[5] WO 2017097996 patent application.

[6] Knaust, S., Andersson, M., Hjort, K., & Klintberg, L. (2016). Influence of surface modifications and channel structure for microflows of supercritical carbon dioxide and water. The Journal of Supercritical Fluids, 107, 649-656.

[7] Bartolo, D., Degre, G., Nghe, P., & Studer, V. (2008). Microfluidic stickers. Lab on a Chip, 8(2), 274-279.

The invention claimed is:

1. A plasma microreactor comprising:
a support, made at least partially of a dielectric material, the support comprising a gas inlet, adapted to be connected to a gas reservoir, a liquid inlet, adapted to be connected to a liquid reservoir and at least a fluid outlet adapted to be connected to a receiver containing gas and/or liquid,
a liquid microchannel in the support adapted to allow a liquid flow from the liquid inlet to the fluid outlet according to a liquid flowing direction,
a gas channel, in the support adapted to allow a gas flow from the gas inlet to the fluid outlet according to a gas flowing direction,
at least a ground electrode,
at least a high voltage electrode, separated from the gas channel by the dielectric material of the support,
wherein said ground electrode and said high voltage electrode are arranged on opposite sides of the gas channel so as to be able to create an electric field inside the gas channel,
wherein the plasma microreactor comprises a contact zone in which the liquid microchannel and the gas channel are contiguous, so that the liquid flowing direction and the gas flowing direction are parallel in the contact zone, at least one opening being arranged between the liquid microchannel and the gas channel in the contact zone so as to form a fluid channel and to cause the liquid flow to contact the gas flow and wherein the liquid flow is retained within the liquid microchannel by capillarity action.

2. The plasma microreactor of claim 1, wherein the at least one opening is arranged between the liquid microchannel and the gas channel on at least 80% of a length of the fluid channel.

3. The plasma microreactor of claim 1, wherein the at least one opening is partially defined by a convex bended portion of a wall of the fluid channel, the bended portion being arranged between the liquid microchannel and the gas channel and extending continuously along a length of the liquid microchannel and along a length of the gas channel.

4. The plasma microreactor of claim 3, wherein the convex bended portion has a radius of curvature being less than 20 µm.

5. The plasma microreactor of claim 1, comprising a high voltage source electrically connected to the ground electrode(s) and to the high voltage electrode(s).

6. The plasma microreactor of claim 1, wherein a length of the liquid microchannel and a length of the gas channel are over 2 cm.

7. The plasma microreactor of claim 1, wherein the support is made of a UV-cured polymer, a poly(tetramethylene succinate), a cyclic olefin copolymer (COC), glass, a ceramic material, or a combination thereof.

8. The plasma microreactor of claim 1, wherein the fluid channel is arranged following a main plane, the design of the fluid channel allowing to have a surface density of the fluid channel in said plane higher than 0.3 over a square of 20 mm2 or more, said fluid channel being arranged in a serpentine pattern.

9. The plasma microreactor of claim 1, wherein the liquid microchannel has a smaller height than the gas channel so as to form a step between the liquid microchannel and the gas channel.

10. The plasma microreactor of claim 1, wherein two liquid microchannels are arranged on opposite sides of the gas channel, so that the fluid channel has a T-shaped section.

11. The plasma microreactor of claim 1, wherein the support comprises glass or ceramic material or comprises a polymeric layer between two glass layers.

12. The plasma microreactor of claim 1, wherein the height of the liquid microchannel is more than 1 µm and is less than 200 µm, and/or wherein the height of the gas channel is comprised between the height of the liquid microchannel and 1 mm.

13. A method for generating a plasma in a plasma microreactor, comprising the steps of:
   (a) providing a plasma microreactor according to claim 1,
   (b) providing a liquid flow through the liquid microchannel(s) in a given direction,
   (c) providing a gas flow through the gas channel in said direction,
   (d) applying a high voltage between the high voltage electrode(s) and the ground electrode(s) so as to generate a plasma in the gas channel.

14. The method of claim 13, wherein the gas flow presents a gas flow rate through the gas channel, wherein the liquid flow presents a liquid flow rate through the liquid channel, the gas flow rate being higher than the liquid flow rate.

15. The method of claim 13, wherein the gas flow comprises a gas selected from the group consisting of air, argon, helium, oxygen, hydrogen, nitrogen, water vapor, ammoniac, carbon dioxide, carbon monoxide, volatile hydrocarbons, volatile organic compounds and a mixture thereof and/or wherein the liquid flow comprises a liquid being an organic or aqueous solvent selected from the group consisting of water, an aliphatic hydrocarbon, an aromatic hydrocarbon, an alcohol, an ether, an ester, a ketone, a halogenated solvent, dimethylsulfoxide (DMSO), acetonitrile, dimethylformamide (DMF), an ionic liquid methyl methacrylate (MMA) and phenol; or a mixture thereof.

16. The method of claim 13, wherein the high voltage is comprised between 250 V and 30 kV and wherein the high voltage is a variable high voltage with a frequency comprised between 100 Hz and 1 MHz or the high voltage is a pulsed voltage with a frequency comprised between 100 Hz and 1 MHz.

17. The method of claim 13, wherein a compound present in the liquid is submitted to at least a chemical reaction such as cleaving, oxidation, hydrogenation, dehydrogenation, amination or carbonylation.

* * * * *